US012320859B2

(12) United States Patent
Kim

(10) Patent No.: US 12,320,859 B2
(45) Date of Patent: Jun. 3, 2025

(54) CHARGING AND DISCHARGING JIG FOR IMPEDANCE MEASUREMENT OF BATTERY CELL

(71) Applicant: LG ENERGY SOLUTION, LTD., Seoul (KR)

(72) Inventor: Ki Hyun Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/037,315

(22) PCT Filed: Sep. 6, 2022

(86) PCT No.: PCT/KR2022/013320
§ 371 (c)(1),
(2) Date: May 16, 2023

(87) PCT Pub. No.: WO2023/043107
PCT Pub. Date: Mar. 23, 2023

(65) Prior Publication Data
US 2024/0077545 A1    Mar. 7, 2024

(30) Foreign Application Priority Data
Sep. 17, 2021  (KR) .................. 10-2021-0124886

(51) Int. Cl.
G01R 31/389 (2019.01)
G01R 31/36 (2020.01)
H01M 10/48 (2006.01)
H02J 7/00 (2006.01)

(52) U.S. Cl.
CPC ....... G01R 31/389 (2019.01); G01R 31/3644 (2013.01); H01M 10/48 (2013.01); H02J 7/0047 (2013.01)

(58) Field of Classification Search
CPC . G01R 31/389; G01R 31/3644; H02J 7/0047; H01M 10/48
See application file for complete search history.

(56) References Cited

FOREIGN PATENT DOCUMENTS

| CN | 111781525 A | 10/2020 |
|---|---|---|
| CN | 213780321 U | 7/2021 |
| EP | 4194869 A1 | 6/2023 |
| JP | 2013-89340 A | 5/2013 |
| JP | 5521944 B2 | 6/2014 |
| KR | 2002-0017367 A | 3/2002 |
| KR | 10-2006-0087163 A | 2/2006 |

(Continued)

Primary Examiner — Amy He
(74) Attorney, Agent, or Firm — Bryan Cave Leighton Paisner LLP

(57) ABSTRACT

A jig for impedance measurement of a battery cell includes: a jig body configured to receive a battery cell in a longitudinal direction; a first bus bar installed on a first side of the jig body, the first bus bar being configured to couple to a first lead part of the battery cell; a second bus bar installed on a second side of the jig body, the second bus bar being configured to couple to a second lead part of the battery cell; an impedance measuring board in the jig body; and a conducting line for impedance measurement connecting the first bus bar, the impedance measuring board, and the second bus bar to constitute an impedance measuring circuit. A part of the conducting line for impedance measurement faces a surface of the battery cell and extends in the longitudinal direction of the battery cell.

16 Claims, 8 Drawing Sheets

(56) References Cited

FOREIGN PATENT DOCUMENTS

| | | |
|---|---|---|
| KR | 10-2008-0074240 A | 8/2008 |
| KR | 10-1359902 B1 | 2/2014 |
| KR | 101447435 B1 | 10/2014 |
| KR | 1020140134518 A | 11/2014 |
| KR | 10-1509206 B1 | 4/2015 |
| KR | 1020170074550 A | 6/2017 |
| KR | 10-2146945 B1 | 8/2020 |

[FIG. 1]
(a)
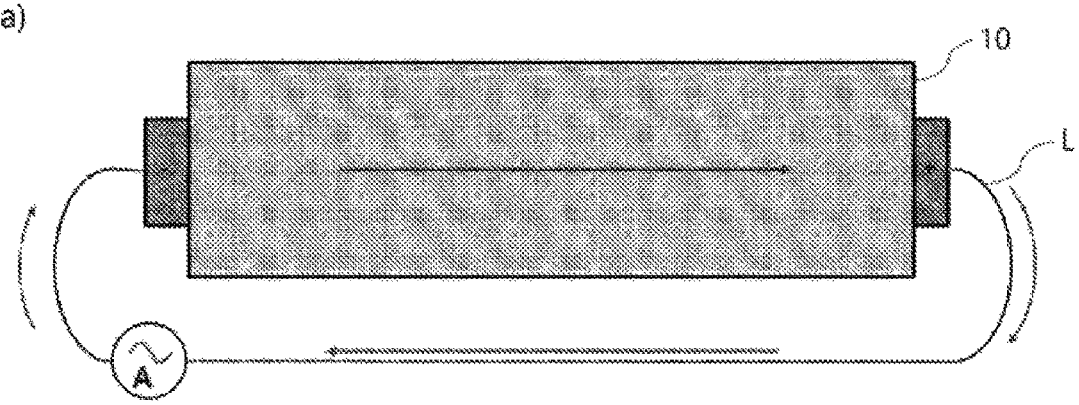
(b)
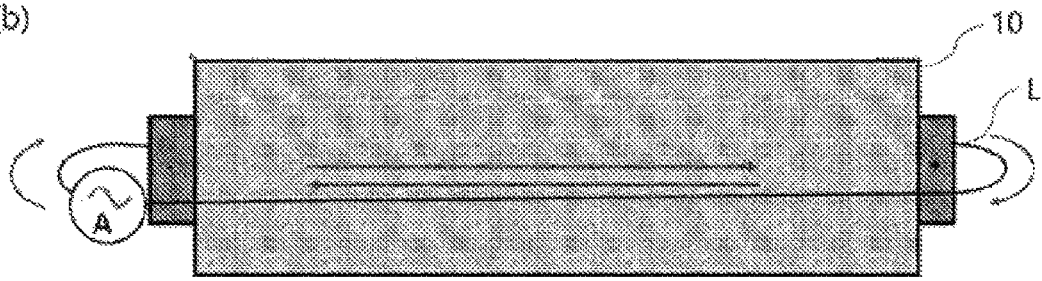

[FIG. 2]
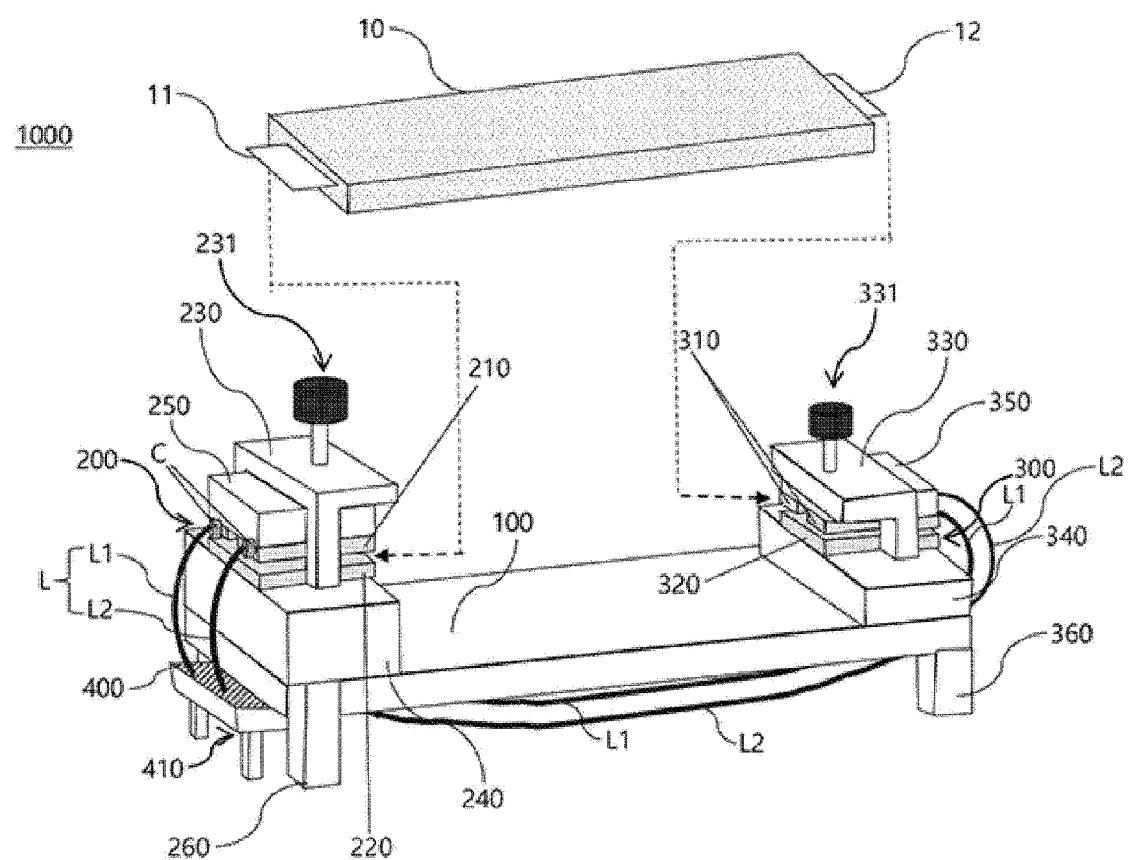

[FIG. 3]
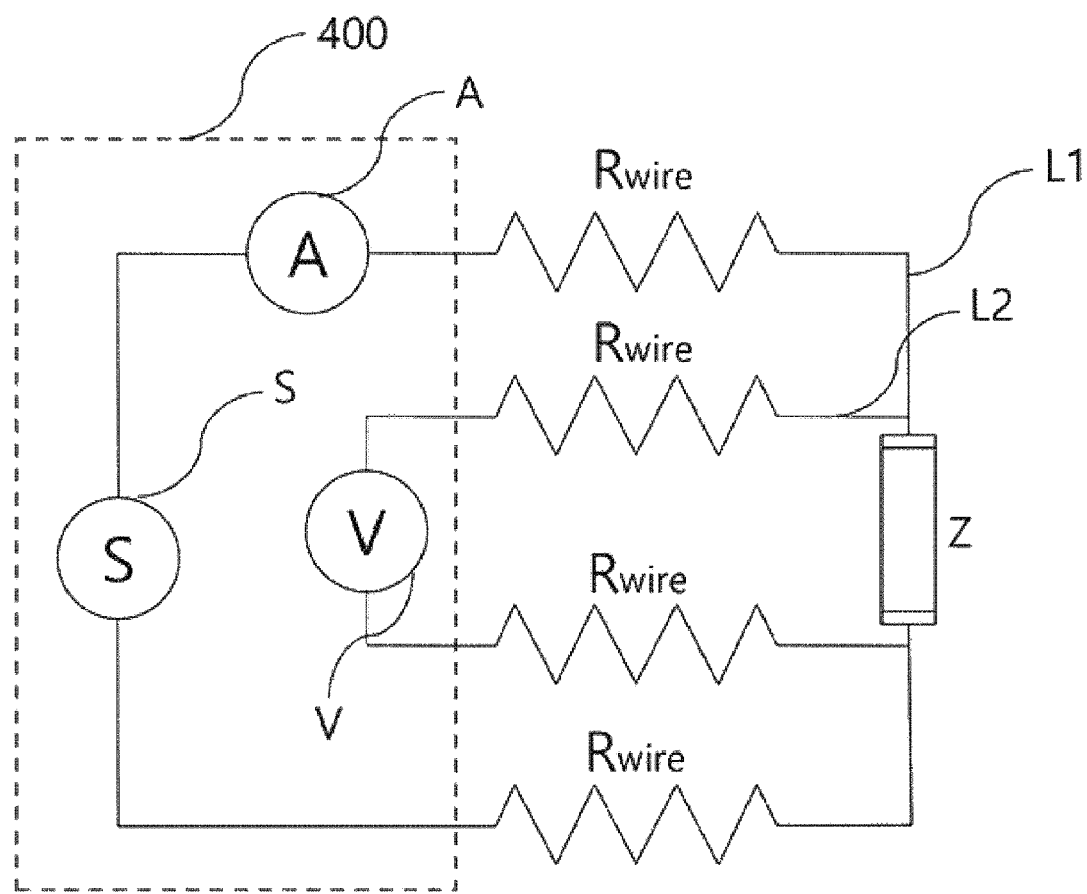

[FIG. 4]
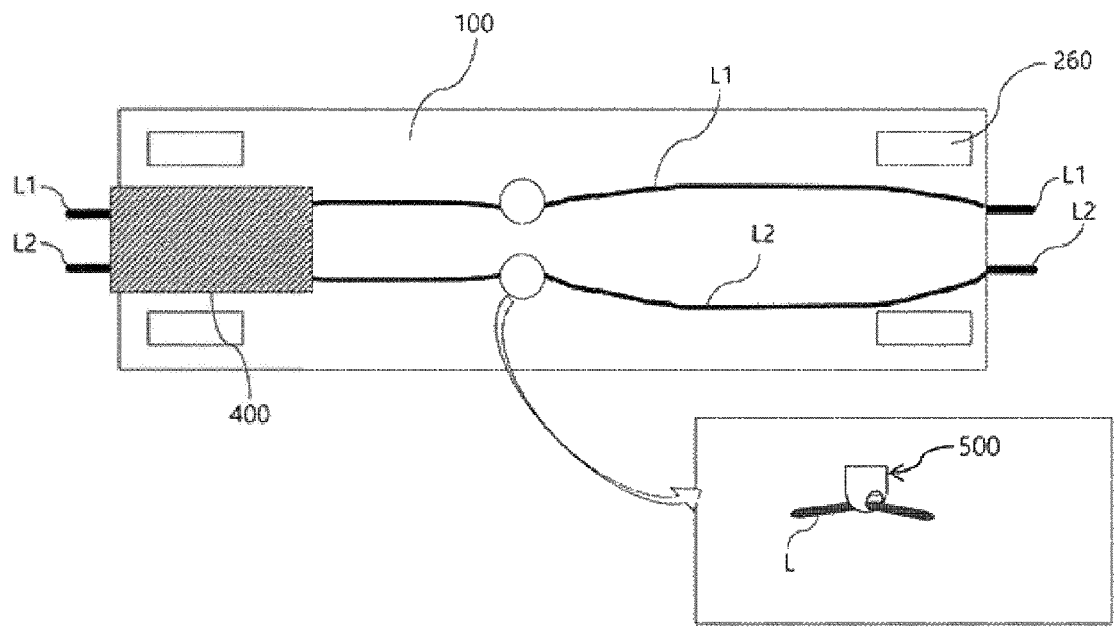

[FIG. 5]
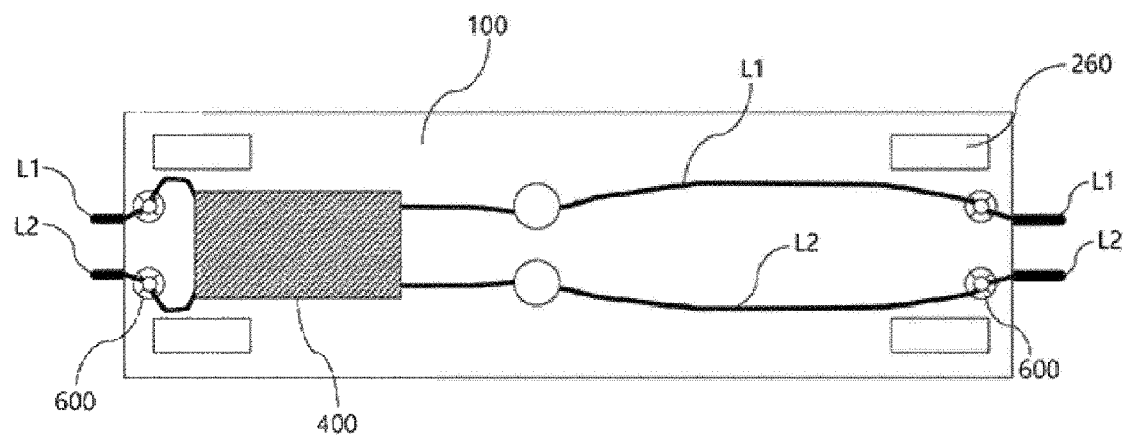

[FIG. 6]
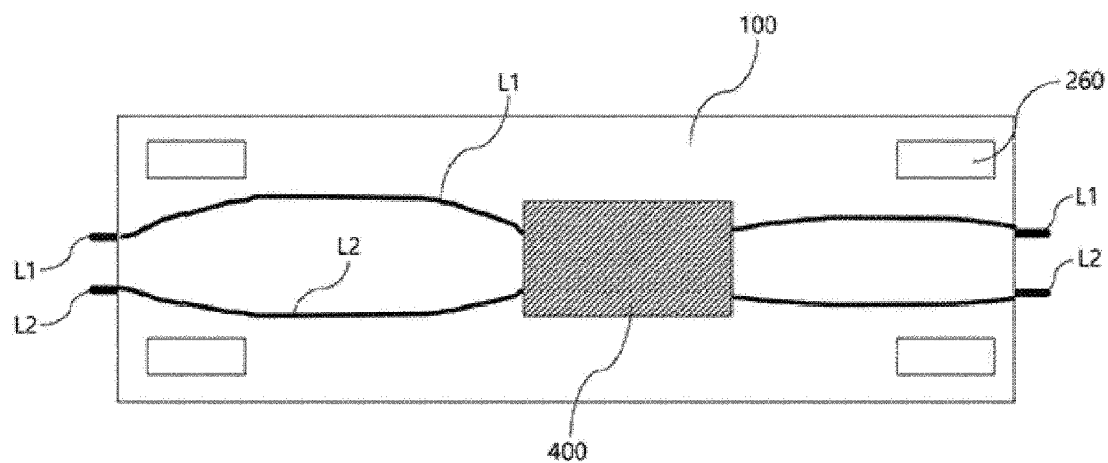

[FIG. 7]
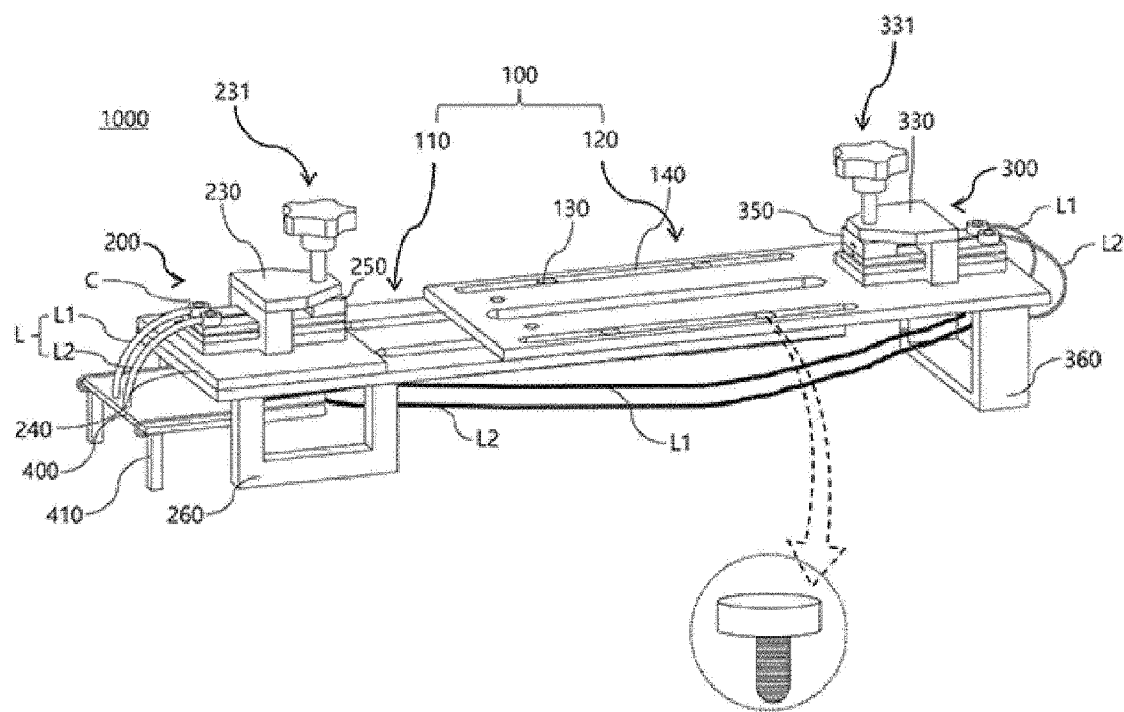

【FIG. 8】
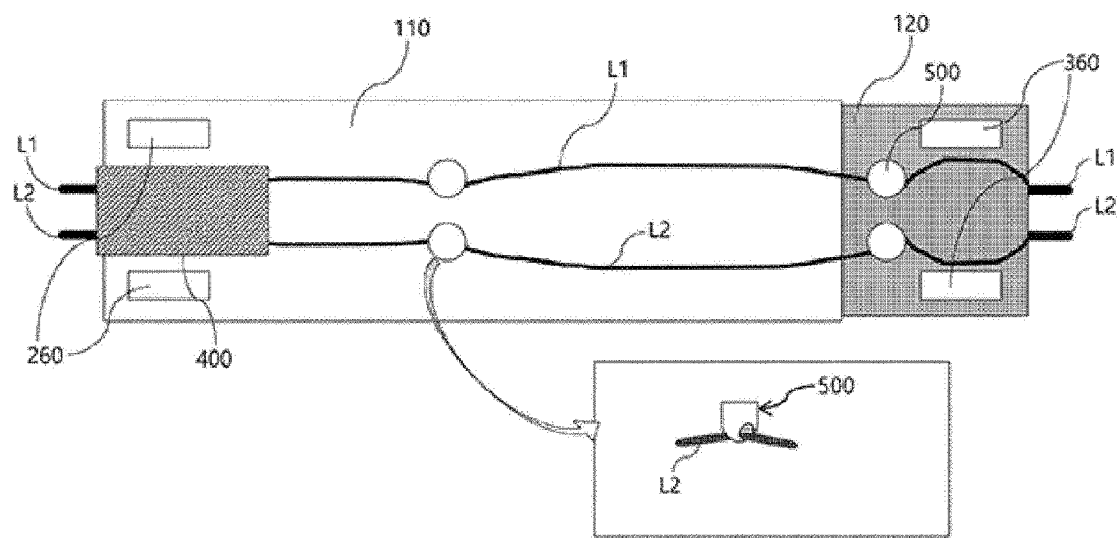

CHARGING AND DISCHARGING JIG FOR IMPEDANCE MEASUREMENT OF BATTERY CELL

CROSS-REFERENCE TO RELATED APPLICATION

This application is a National Phase entry pursuant to 35 U.S.C. 371 of International Application No. PCT/KR2022/013320 filed on Sep. 6, 2022, which claims priority to and the benefit of Korean Patent Application No. 10-2021-0124886, filed on Sep. 17, 2021, and the entire contents of the Korean patent application are incorporated herein by reference.

TECHNICAL FIELD

The present disclosure relates to a charging and discharging jig for impedance measurement of a battery cell.

BACKGROUND

Recently, secondary batteries capable of charging and discharging have been widely used as energy sources of wireless mobile devices. In addition, secondary batteries have attracted attention as an energy source of an electric vehicle, a hybrid electric vehicle, etc., which are proposed as a solution to air pollution of existing gasoline vehicles and diesel vehicles using fossil fuel. Therefore, the types of applications using secondary batteries are currently becoming much more diverse due to the advantages of secondary batteries, and secondary batteries are expected to be applied to many fields and products in the future.

Such secondary batteries may be classified into lithium ion batteries, lithium ion polymer batteries, lithium polymer batteries, etc., depending on the composition of the electrolyte and the electrode, and among them, the use of lithium-ion polymer batteries that are less likely to leak electrolyte and are easy to manufacture is increasing. In general, secondary batteries are classified depending on the shape of a battery case into cylindrical batteries and prismatic batteries in which an electrode assembly is embedded in a cylindrical or prismatic metal can, and pouch-type batteries in which the electrode assembly is embedded in a pouch-type case of an aluminum laminate sheet. The electrode assembly embedded in the battery case is composed of a positive electrode, a negative electrode, and a separator interposed between the positive electrode and the negative electrode, and is a power generating element capable of charging and discharging. The electrode assembly is classified into a jelly-roll type wound with a separator interposed between a positive electrode and a negative electrode which are long sheet-shaped and are coated with active materials, or a stack type in which a plurality of positive electrodes and negative electrodes of a predetermined size are sequentially stacked with separators interposed therebetween.

In order to inspect the safety and performance of such secondary batteries, various tests may be performed. Among them, a method of evaluating the safety and performance of a battery by measuring the impedance of the battery cell is being relied upon more and more. By measuring the impedance of the battery cell in this way, main factors such as life, capacity, and charge state can be estimated.

The measurement results of impedance of a battery cell vary depending on the length change or movement of a measuring conducting line (or wire). In the case of a cylindrical battery with a short length and a large impedance value, the influence of a wire (or line) is relatively less, but in the case of a medium- or large-sized pouch-type battery with a long length and a small impedance value, the measured impedance value has a large deviation according to the length or movement of a wire (or line). The impedance of such a battery cell can be measured by installing a battery cell in a charging and discharging jig that can be displaced in a longitudinal direction of the battery cell.

Specifically, the impedance is measured by installing leads each having different polarities of a battery cell on charging and discharging bus bars installed on both sides of a charging and discharging jig, and connecting wires (or lines) to the charging and discharging bus bars.

Conventionally, the impedance of a battery cell was measured by installing a battery cell and a charging and discharging jig for impedance measurement in which the battery cell is installed in a temperature chamber, and connecting an impedance measuring device (for example, an EIS measuring device) and the charging and discharging jig with a conducting line from the outside. Since the impedance measuring device and the charging and discharging jig occupy a large volume, there has been difficulty installing the impedance measuring device and the charging and discharging jig in the temperature chamber. Thus, when the impedance measuring device is installed outside the temperature chamber, the length of the conducting line connecting the battery cell and the impedance measuring device naturally increases. Thus, as the length of the conducting line increases, the impedance component (inductance) according to the length of the conducting line increases, which acts as noise in the impedance measurement of the battery cell, making it difficult to accurately measure the impedance of the battery cell. Moreover, when the conducting line is extended outside the battery cell at length, a magnetic field caused by the current flowing through the battery cell and a magnetic field caused by the conducting line cannot be offset, and therefore an impedance disturbance effect due to the noise caused by this magnetic field inevitably occurs. This problem is more serious in the case of a medium- or large-sized pouch type battery having a long battery cell length and a small impedance value.

Hence, there is a need to develop a device capable of more accurately measuring the impedance of a battery cell by reducing the effect of a magnetic field caused by the current of the battery cell and a conducting line while reducing the length of the conducting line for impedance measurement.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section. The present disclosure is directed to providing a charging and discharging jig for impedance measurement of a battery cell in which a conducting line for impedance measurement can be formed short and the conducting line can be installed to extend in parallel with the battery cell while facing the battery cell.

SUMMARY

In one example, jig for impedance measurement of a battery cell of the present disclosure for solving the above problems may include: a jig body configured to receive a battery cell in a longitudinal direction; a first bus bar installed on a first side of the jig body, the first bus bar being configured to couple to a first lead part of the battery cell; a second bus bar installed on a second side of the jig body, the second bus bar being configured to couple to a second lead part of the battery cell; an impedance measuring board in the jig body; and a conducting line for impedance measurement connecting the first bus bar, the impedance measuring board, and the second bus bar to constitute an impedance measuring circuit, and a part of the conducting line for impedance measurement faces a surface of the battery cell and extends in the longitudinal direction of the battery cell.

In other aspects, the jig for impedance measurement of the battery cell described herein may include one or more of the following features. The conducting line for impedance measurement may include a signal line configured to apply an AC signal to the battery cell and a sensing line configured to measure a voltage of the battery cell. The first bus bar may include a first upper bus bar and a first lower bus bar, and the second bus bar may include a second bus bar and a second lower bus bar, and the conducting line for impedance measurement may be connected to the first upper bus bar, the second upper bus bar, or the second lower bus bar. The signal line and the sensing line may be connected to the first upper bus bar and the second upper bus bar. The impedance measuring board may include an AC signal source and an ammeter connected to the signal line, and a voltmeter connected to the sensing line. The impedance measuring board may be installed on a lower part of the jig body, and the conducting line for impedance measurement may include a loop connecting the first bus bar, the impedance measuring board, and the second bus bar, and a part of the loop may extend in the longitudinal direction of the battery cell along a bottom surface of the jig body. The jig may further include pedestals installed on a first lower side of the jig body and a second lower side of the jig body, and the impedance measuring board may be installed on the pedestal or the lower part of the jig body adjacent to the pedestals. The jig may further include pedestals installed on both lower sides of the jig body, and the impedance measuring board may be installed on a measuring board support coupled to the pedestals. The jig may further include a conducting line support member on a bottom surface of the jig body, and the conducting line support member may be configured to support a conductive line extending in the longitudinal direction of the battery cell along the bottom surface of the jig body. the jig may further include fixing jigs on a first side and a second side of the bottom surface of the jig body, and the fixing jigs may be configured to fix a first side and a second side of a conducting line extending in the longitudinal direction of the battery cell along the bottom surface of the jig body may be installed on both sides of the bottom surface of the jig body. The impedance measuring board may be installed in a middle of the bottom surface of the jig body, and the loop may be drawn out to a first side and a second side of the impedance measuring board and extend toward each of the first bus bar and the second bus bar. The jig body may include a fixed block and a movable block slidably coupled to the fixed block, and the first bus bar may be installed on a side of the fixed block, and the second bus bar may be installed on a side of the movable block. The movable block may be slidably coupled to an upper surface of the fixed block. Guide slits may be formed on first and second sides of at least one of the fixed block or the movable block, and sliding support members inserted into the guide slits may be installed on the fixed block that does not include the guide slits. Each of the sliding support members may have a body part inserted into at least one of the guide slits and screwed to the fixed block or the movable block, and a head part may have a width greater than that of the at least one of the guide slits. The jig may be configured to charge and discharge the battery cell.

According to the present disclosure, by reducing the length of a conducting line for impedance measurement, the influence of an inductance according to the length of a wire (or conductive line) can be minimized, thereby reducing the noise of impedance measurement.

In addition, since a conducting line for impedance measurement has a structure that can be installed to face a wide surface of a battery cell and extend in a longitudinal direction of the battery cell, the impedance of the battery cell can be more accurately measured by offsetting a magnetic field caused by the battery cell and a magnetic field caused by the conducting line.

The effects of the present disclosure are not limited to the effects mentioned above and additional other effects not described above will be clearly understood from the description of the appended claims by those skilled in the art.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 1 is a schematic diagram illustrating a difference between impedance measuring mechanisms by a conventional impedance measuring device and a charging and discharging jig for impedance measurement of the present disclosure.

FIG. 2 is a perspective view of a charging and discharging jig for impedance measurement of a battery cell according to one exemplary embodiment of the present disclosure.

FIG. 3 is a schematic diagram illustrating a connection relationship between a conducting line for impedance measurement and an impedance measuring board and an impedance measuring circuit constituted by the conducting line and the measuring board according to the present disclosure.

FIG. 4 is a bottom view of the charging and discharging jig for impedance measurement of FIG. 2.

FIG. 5 is a bottom view of a charging and discharging jig for impedance measurement of a battery cell according to another exemplary embodiment of the present disclosure.

FIG. 6 is a bottom view of a charging and discharging jig for impedance measurement of a battery cell according to still another exemplary embodiment of the present disclosure.

FIG. 7 is a perspective view of a charging and discharging jig for impedance measurement of a battery cell according to another exemplary embodiment of the present disclosure.

FIG. 8 is a bottom view of the charging and discharging jig for impedance measurement of FIG. 7.

DETAILED DESCRIPTION

Hereinafter, the detailed configuration of the present disclosure will be described in detail with reference to the accompanying drawings and various exemplary embodiments. The exemplary embodiments described below are illustratively shown to help with understanding of the present disclosure, the accompanying drawings may not be illustrated on an actual scale but sizes of some components may be exaggerated in order to help with understanding of the present disclosure.

In the present disclosure, since various modifications may be made and various forms may be applied, specific exemplary embodiments are illustrated in the drawings and described in detail in the text. However, this is not intended to limit the present disclosure to the specific disclosed forms, which should be understood to include all modifications, equivalents and substitutes included in the spirit and scope of the present disclosure.

As described above, the present disclosure provides a charging and discharging jig for impedance measurement of a battery cell 10 in which a conducting line L for impedance measurement can be formed short and the conducting line can be installed to extend in parallel with the battery cell 10 while facing the battery cell 10.

FIG. 1 is a schematic diagram illustrating a difference between impedance measuring mechanisms by a conventional impedance measuring device and an impedance measuring board 400 of the present disclosure.

Conventionally, a battery cell and a charging and discharging jig for impedance measurement are installed in a temperature chamber, and an impedance measuring device (e.g., EIS measuring device) and a charging and discharging device are installed outside the temperature chamber to charge and discharge the battery cell and measure the impedance of the battery cell at the same time. Since the impedance measuring device and the charging and discharging device occupy a significant volume, the impedance measuring device and the charging and discharging device cannot be installed in the temperature chamber due to the size limitation of the space of the temperature chamber. For this reason, the configuration of the conducting line for impedance measurement during charging and discharging of the conventional battery cell had to be as shown in FIG. 1A. Referring to FIG. 1, when measuring the impedance of a battery cell, a conducting line constitutes a loop shape connecting both leads of the battery cell and an impedance measuring device that is not shown. In this case, as described above, when the impedance measuring device is installed outside the temperature chamber, the loop of the conducting line connected to the battery cell lead becomes longer as shown in FIG. 1A. Accordingly, the length of the conducting line increases and an inductance component of the conducting line increases, which acts as noise when measuring the impedance of the battery cell. In addition, since the conducting line is in the form of a long extension, whenever the wire (or conductive line) is connected to the battery cell, there is a problem that the arrangement of the wire (or conductive line) slightly changes and the impedance measurement result changes accordingly. In addition, in the case of FIG. 1A, a magnetic field is generated by the current flowing along the battery cell. An impedance value of the battery cell may be disturbed by this magnetic field.

On the other hand, as shown in FIG. 1B, when the conducting line for impedance measurement is disposed adjacent to the battery cell, the length of the conducting line is shortened, and thus the influence of an inductance can be significantly reduced. In addition, in FIG. 1B, the conducting line for impedance measurement faces a wide surface of the battery cell and extends in parallel to the longitudinal direction of the battery cell. In this case, as shown in FIG. 1B, because the directions of the current flowing along the battery cell and the current flowing along the conducting line are opposite, the directions of the magnetic fields caused by the currents are also opposite. That is, as shown in FIG. 1B, when the conducting line (circuit) for impedance measurement can be constituted, the magnetic fields of the battery cell and the conducting line may be offset from each other.

In this case, the impedance of the battery cell may be more accurately measured without being disturbed by the magnetic fields.

The present disclosure significantly shortens the length of a conducting line for impedance measurement connected to a battery cell by directly installing an impedance measuring board in a charging and discharging jig for impedance measurement of the battery cell, and excludes the influence of a magnetic field by extending the conducting line as shown in FIG. 1B.

Specific details regarding a charging and discharging jig for impedance measurement of a battery cell 10 of the present disclosure will be described with reference to exemplary embodiments and drawings.

First Exemplary Embodiment

FIG. 2 shows a first exemplary embodiment of a charging and discharging jig 1000 for impedance measurement of a battery cell 10 of the present disclosure.

Referring to FIG. 2, a charging and discharging jig for impedance measurement of the battery cell 10 of the present disclosure includes: a jig body 100 on which the battery cell 10 is mounted in a longitudinal direction; a first bus bar 200 and a second bus bar 300 installed on both sides of the jig body 100 and to which lead parts 11 and 12 of both ends of the battery cell 10 are each coupled; an impedance measuring board 400 installed in the jig body 100; and a conducting line L for impedance measurement connecting the first bus bar 200, the impedance measuring board 400, and the second bus bar 300 to constitute an impedance measuring circuit, and a part of the conducting line L for impedance measurement has a part facing a wide surface of the battery cell and extending in the longitudinal direction of the battery cell 10.

The battery cell 10 is installed in the jig body 100 in the longitudinal direction, that is, so that electrode leads at both ends are disposed on both sides of the jig body 100. In FIG. 2, the jig body 100 is in the form of a fixed jig whose length does not change. However, as will be described below, the jig body 100 may be constituted in the form of a variable jig of which the length can be adjusted in the longitudinal direction in accordance with the length of the battery cell.

First, in order to measure the impedance of the battery cell 10, the battery cell 10 is positioned on the jig body 100, and the first and second bus bars on both sides of the charging and discharging jig are connected to the lead parts 11 and 12 of the battery cell 10. The first and second bus bars are both connected to the impedance measuring board 400 through the conducting line L for impedance measurement.

The impedance measuring board 400 of the present disclosure corresponds to the conventional impedance measuring device, and is constituted in the form of a small substrate required for impedance measurement by greatly simplifying the detailed configuration of a complex impedance measuring device. Therefore, by being made as a small substrate, the impedance measuring board can be easily introduced into a temperature chamber when measuring the impedance in the temperature chamber. In particular, in the present disclosure, the impedance measuring board is installed in the jig body. As a result, the length of the conducting line for impedance measurement constituted through the leads of both ends of the battery cell and the impedance measuring board is greatly shortened. That is, since an impedance measuring unit is installed in the charging and discharging jig, there is no need to extend the conducting line at length to the outside as in the conventional art.

Specifically, the impedance measuring board 400 of the present disclosure includes an AC signal source S configured to transmit an AC signal to the battery cell 10, a voltmeter V configured to measure a voltage difference between both ends of the battery cell 10, and an ammeter A configured to measure a current.

FIG. 3 illustrates a circuit for sensing voltages applied to both ends of the lead parts 11 and 12 of the battery cell 10 by a four-terminal method. Referring to this, it can be seen that the conducting line L connected to the AC signal source S and the voltmeter V is connected to both ends of the battery cell 10. The conducting line L for impedance measurement is composed of a signal line L1 configured to apply an AC signal to the battery cell and a sensing line L2 configured to measure a voltage of the battery cell. In FIG. 3, the signal line L1 and the sensing line L2 are connected to the battery cell. By applying an AC signal from the AC signal source S, an AC current is applied to the battery cell 10 through the signal line L1. Since the battery cell 10 contains a predetermined impedance component, a potential difference (voltage) is generated at both ends of the lead parts 11 and 12 of the battery cell 10 by the application of the AC current. At this time, the current moving through the conducting line L is measured by the ammeter A, and the voltage difference between both ends of the battery cell 10 may be measured by the voltmeter V. The impedance of the battery cell 10 may be measured through the measured values of the ammeter A and the voltmeter V. The ammeter A and the voltmeter V provided in the impedance measuring board 400 are connected to an external computing device or display device, so that the current and voltage may be visually expressed. The computing device may calculate the impedance of the battery cell 10 by dividing the voltage value by the AC current value, and the calculated impedance value may be displayed on the display device.

Referring back to FIG. 2, it can be seen that the first bus bar 200 coupled to the lead parts 11 and 12 of the battery cell 10 and the impedance measuring board 400 are connected by the signal line L1 and the sensing line L2. The signal line L1 and the sensing line L2 may be coupled to the first and second bus bars by a coupling member C or the like, respectively. The coupling member C may be a screw member for coupling the signal line and the sensing line to the bus bar, but is not limited thereto. The signal line L1 is connected to the AC signal source S and the ammeter A of the impedance measuring board 400, and the sensing line L2 is connected to the voltmeter V of the impedance measuring board 400. The AC signal source S and the ammeter A of the measuring board 400 are connected to the second bus bar 300 by the signal line L1, and the voltmeter V is connected to the second bus bar 300 by the sensing line L2.

The conducting line L for impedance measurement of the present disclosure preferably constitutes a loop connecting the first bus bar 200, the impedance measuring board 400, and the second bus bar 300. Referring to FIG. 2, it can be seen that the conducting line L extends from the first bus bar 200 to the second bus bar 300 across the measuring board 400, and a part of the conducting line L (signal line: L1 and sensing line: L2) constituting the loop extends in the longitudinal direction of the battery cell 10 along the bottom surface of the jig body 100.

Meanwhile, the charging and discharging jig of the present disclosure includes the first bus bar 200 and the second bus bar 300 coupled to the lead parts 11 and 12 at both ends of the battery cell 10. Referring to FIG. 2, the first and second bus bars are inserted into and positioned in bus bar coupling frames 230 and 330 in which installation holes are formed so that the bus bars may be inserted thereinto.

The first and second bus bars are composed of upper bus bars 210 and 310 and lower bus bars 220 and 320 located below the upper bus bars 210 and 310, respectively, and the conducting line L for impedance measurement is connected to the upper bus bars 210 and 310 or the lower bus bars 220 and 320. Although not shown, when the conducting line L for impedance measurement is connected to the upper bus bars 210 and 310, the lower bus bars 220 and 320 are separately connected to a charging and discharging device configured to charge and discharge the battery cell 10 by the conducting line L.

The upper bus bars 210 and 310 or the lower bus bars 220 and 320 of the first bus bar 200 and the second bus bar 300 may each be separated into two bus bars. More preferably, among the upper bus bars 210 and 310 and the lower bus bars 220 and 320, the bus bars connected to the conducting line L for impedance measurement may be separated into two bus bars again. As described above, since the present disclosure measures the impedance using the four-terminal method, the upper bus bar or the lower bus bar is divided into two pieces so that a plurality of conducting lines may be connected to each of the separated bus bars.

In the exemplary embodiment of FIG. 2, the upper bus bars 210 and 310 of the first bus bar 200 and the second bus bar 300 are each separated into two bus bars, and the signal line L1 and the sensing line L2 are connected to each of the separated bus bars.

Meanwhile, insulators 250 and 350 are installed between the upper bus bars 210 and 310 and the bus bar coupling frames 230 and 330, and the insulators 250 and 350 are coupled to upper parts of the upper bus bars. Adjustment screw parts 231 and 331 on the bus bar coupling frames 230 and 330 are screw-coupled to the insulators 250 and 350 through the bus bar coupling frames 230 and 330. Therefore, when the adjustment screw parts 231 and 331 are rotated, the insulators 250 and 350 and the upper bus bars 210 and 310 are lifted up and down, and accordingly, the lead parts 11 and 12 of the battery cell 10 may be easily inserted and removed between the upper bus bars 210 and 310 and the lower bus bars 220 and 320.

The bus bar coupling frames 230 and 330 configured to fix the first and second bus bars and the insulators 250 and 350 are fixed to both sides of the jig body 100, and at this time, bus bar support members 240 and 340 may be further interposed as needed between the bus bar coupling frames 230 and 330 and the jig body 100 for adjusting the height of the bus bars and supporting the bus bar coupling frames 230 and 330.

The jig body 100 of the present disclosure may further include pedestals 260 and 360 installed on both lower sides thereof. The pedestals 260 and 360 are coupled to the jig body 100 and serve to stably support the jig body 100.

Another characteristic point of the present disclosure is that the measuring board 400 is installed close to the jig body 100, so that the length of the conducting line L may be reduced as much as possible. The measuring board 400 may be installed on the upper part of the jig body 100 or on the lower part of the jig body as shown in FIG. 2. According to one exemplary embodiment, the impedance measuring board 400 is installed on the pedestals 260 and 360 or on the lower part of the jig body 100 adjacent to the pedestals 260 and 360. In this case, the measuring board 400 may be screwed to the pedestals 260 and 360 or to the lower part of the jig body 100, or may be adhesively coupled. However, the present disclosure is not limited thereto, and it may be installed at a desired location using any means that can fix the measuring board 400. According to another exemplary embodiment, the impedance measuring board 400 may be installed on a support 410 for the measuring board 400 that can support the measuring board 400, and at this time, the support 410 for the measuring board 400 may be preferably coupled to the pedestals 260 and 360 included on both sides of the lower part of the jig body 100.

FIG. 4 is a bottom view of the charging and discharging jig for impedance measurement of FIG. 2.

As shown in FIG. 4, a support member 500 for the conducting line L configured to support a wire (or conductive line) extending in the longitudinal direction of the battery cell 10 along the bottom surface of the jig body 100 may be installed on the bottom surface of the jig body 100 of the present disclosure. The support member 500 for the conducting line L is perforated from one side to the other side, and the conducting line L is hung through the perforation. At this time, the size of the perforation should be greater than the thickness of the conducting line L, and the movement of the conducting line L in the longitudinal direction of the battery cell 10 should not be disturbed by the support member 500 for the conducting line L. The conducting line L is reliably supported by the charging and discharging jig by the conducting line support member 500 to prevent a change in tension of the conducting line. That is, since the conducting line is stably supported by the conducting line support member and thus the length of the conducting line does not change, the accuracy of impedance measurement can be improved.

FIG. 5 is a bottom view of a charging and discharging jig for impedance measurement of a battery cell according to another exemplary embodiment of the present disclosure.

On the bottom surface of the jig body 100 of the present disclosure, as shown in FIG. 5, a fixing jig 600 configured to fix both sides of the conducting line L extending in the longitudinal direction of the battery cell 10 along the bottom surface of the jig body 100 may be installed. The fixing jig 600 includes a shape in which the conductive line L can be inserted, and the conductive line L inserted into the fixing jig 600 is limited in movement and fixed, unlike the support member. Impedance measurement may be easily performed by installing the fixing jig 600 at a position where the conducting line L is to be fixed, and fixing the conducting line L to the bottom of the jig body 100 by inserting the conducting line L into the fixing jig 600. The accuracy of impedance measurement is improved as the conducting line is fixedly coupled to the charging and discharging jig without floating by the conducting line support member 500 and the fixing jig.

FIG. 6 is a bottom view of a charging and discharging jig for impedance measurement of a battery cell according to still another exemplary embodiment of the present disclosure.

In this exemplary embodiment, the impedance measuring board 400 is installed in the middle of the bottom surface of the jig body 100. In the present disclosure, since the impedance measuring board 400 is installed in the jig body 100, the length of the conducting line for impedance measurement is shortened as described above. In this case, the impedance measuring board 400 may be installed on an upper part, a side part, and a lower part of the jig body. However, when installed on the upper part of the jig body 100, it may be an obstacle to installation of the battery cell on the jig, so that it is preferable to install the impedance measuring board on the side part or the lower part of the jig body. In addition, since the bus bars are installed on both sides of the jig body, it may be better to install the impedance measuring board on the lower part of the jig body in consideration of bus bar installation space. When the impedance measuring board is installed on the lower part the jig body 100, it may be installed on one of both sides of the jig body 100 as shown in FIG. 2. In addition, as shown in FIG. 6, it is also possible to install the impedance measuring board in the middle of the bottom surface of the jig body 100. The important thing is to measure the impedance while shortening the length of the conducting line for impedance measurement by coupling the impedance measuring board on a line in which the conducting line for impedance measurement extends.

As the measuring board 400 is installed in the middle of the jig body 100, a part of the conducting line L constituting the loop is drawn out to both sides of the impedance measuring board 400 and extends toward each of the first bus bar 200 and the second bus bar 300. At this time, even if the conducting line L is drawn out to both sides of the measuring board 400, a magnetic field offsetting effect can be maintained because the conducting line L is still in a position where it faces the wide surface of the battery cell 10.

Second Exemplary Embodiment

FIG. 7 is a perspective view of a charging and discharging jig for impedance measurement of a battery cell according to another exemplary embodiment of the present disclosure.

This exemplary embodiment is in the form of a variable jig in which the charging and discharging jig for impedance measurement may be displaced in the longitudinal direction. By changing the length of the jig, there is an advantage that the jig length can be adjusted to match different types of battery cells.

Referring to FIG. 7, a jig body 100 includes a fixed block 110 and a movable block 120 slidably coupled to the fixed block 110, a first bus bar 200 is installed on one side of the fixed block 110, and a second bus bar 300 is installed on one side of the movable block 120.

According to the second exemplary embodiment, the jig body 100 of the present disclosure can be variably deformed to measure an impedance in accordance with the length of the battery cell 10. Specifically, the jig body 100 includes the fixed block 110 and the movable block 120 sliding in the longitudinal direction of the battery cell 10 with respect to the fixed block 110. Among the conducting lines L used at this time, a conducting line L extending along the bottom surface of the jig body 100 should be installed assuming that the fixed block 110 and the movable block 120 are as far away as possible so that the jig body 100 can be freely deformed. The movable block 120 may be slidably coupled to any one of the bottom surface and the upper surface of the fixed block 110. However, in this case, between two blocks, it is preferable that an impedance measuring board 400 be installed on the bottom surface of the block located lower than the other block. When the movable block 120 is slidably coupled to the upper surface of the fixed block 110 as shown in FIG. 7, the measuring board 400 is installed on the lower surface of the fixed block 110 located relatively lower. Coupling by sliding of the movable block 120 and the fixed block 110 may be performed by coupling guide slits 140 and sliding support members 130. For example, the guide slits 140 may be formed on both sides in a width direction of one of the fixed block 110 and the movable block 120, and the sliding support members 130 inserted into the guide slits may be installed on the other of the fixed block 110 and the movable block 120. As the sliding support members 130 slide along the guide slits 140, the movable block 120 may slide along the fixed block 110. At this time, the guide slits 140 may be installed in any one of the fixed block 110 and the movable block 120. In the exemplary embodiment of FIG. 7, the guide slits 140 are formed on both sides of the movable block 120 in the width direction, and the sliding support members 130 are formed on both sides of the fixed block 110 in the width direction. Each of the sliding support members 130 may have a body part inserted into the guide slit 140 and screwed to the fixed block 110 or screwed to the movable block 120, and a head part having a width greater than that of the guide slit. Since the head part has a width greater than that of the guide slit 140, separation of the sliding support member 130 from the guide slit 140 may be prevented, and thus separation of the movable block 120 from the fixed block 110 may be prevented. In addition, since the body part of the sliding support member 130 has a screw thread and is screw-coupled to the fixed block 110 or the movable block 120, the movable block 120 may be fixed to the fixed block 110 by adjusting the degree of the screw coupling. That is, after the movement of the movable block 120 is completed, when the sliding support member 130 is further rotated to move the head part downward, the head part presses edges of both sides of the guide slit 140 so that the movable block 120 may be fixed to the fixed block 110.

FIG. 8 is a bottom view of the charging and discharging jig for impedance measurement of FIG. 7.

FIG. 8 shows an exemplary embodiment in which a support member 500 for the conducting line L is applied to the charging and discharging jig for impedance measurement of the battery cell 10 of the second exemplary embodiment. In order to maintain the effect of offsetting the magnetic field generated in the battery cell 10, the conducting line L of the present disclosure should deviate as little as possible from the wide surface range of the battery cell 10. The support member 500 for the conducting line L is installed at an appropriate position when the movable block 120 slides on the fixed block 110 and the deformation of the conducting line L increases, thereby minimizing the deformation of the conducting line L. However, it is necessary to avoid the installation of the support member 500 for the conducting line L on a sliding path so that the sliding of the movable block 120 is not disturbed by the support member 500 for the conducting line L. As shown in FIG. 8, the conducting line can be maintained in the jig without sagging by installing the support member 500 in the middle and on one side of the jig, and installing the impedance measuring board on the other side to connect the conducting line. In addition, when the movable block moves, the conducting line may inevitably sag downward, but since the conducting line is supported by the plurality of support members 500, the degree of sagging can be reduced. Also in this exemplary embodiment, since a part of the conducting line extends in the longitudinal direction of the battery cell, as shown in FIG. 1B, the magnetic field caused by the current flowing in the battery cell may be offset by the magnetic field caused by the conducting line.

The present disclosure has been described above in more detail through drawings and exemplary embodiments. However, since the configurations described in the drawings or exemplary embodiments, etc. described in the present specification are only one exemplary embodiment of the present disclosure and do not represent all the technical ideas of the present disclosure, it should be understood that there may be various equivalents and variations that can replace them at the time of filing of the application.

DESCRIPTION OF REFERENCE NUMERALS

10, Z: battery cell
11, 12: lead parts
100: jig body
110: fixed block
120: movable block
130: sliding support member
140: guide slit
200: first bus bar
300: second bus bar
210, 310: upper bus bars
220, 320: lower bus bars
230, 330: bus bar coupling frames
231, 331: adjustment screw parts
240, 340: bus bar support members
250, 350: insulators
260, 360: pedestals
400: measuring board
410: measuring board support member
500: conducting line support member
600: fixing jig L: conducting line
L1: signal line
L2: sensing line
A: ammeter
V: voltmeter
S: AC signal source
Rwire: conducting line resistance
C: coupling member

What is claimed is:

1. A charging and discharging jig for impedance measurement of a battery cell, the charging and discharging jig comprising:
a jig body configured to receive a battery cell in a longitudinal direction;
a first bus bar installed on a first side of the jig body, the first bus bar being configured to couple to a first lead part of the battery cell;
a second bus bar installed on a second side of the jig body, the second bus bar being configured to couple to a second lead part of the battery cell;
an impedance measuring board in the jig body; and
a conducting line for impedance measurement connecting the first bus bar, the impedance measuring board, and the second bus bar to constitute an impedance measuring circuit,
wherein a part of the conducting line for impedance measurement faces a surface of the battery cell and extends in the longitudinal direction of the battery cell.

2. The jig of claim 1, wherein the conducting line for impedance measurement includes a signal line configured to apply an AC signal to the battery cell, and a sensing line configured to measure a voltage of the battery cell.

3. The jig of claim 2, wherein the first bus bar includes a first upper bus bar and a first lower bus bar,
wherein the second bus bar includes a second upper bus bar and a second lower bus bar, and
wherein the conducting line for impedance measurement is connected to the first upper bus bar, the second upper bus bar, a first lower bus bar, or the second lower bus bar.

4. The jig of claim 3, wherein the signal line and the sensing line are connected to the first upper bus bar and the second upper bus bar.

5. The jig of claim 2, wherein the impedance measuring board includes an AC signal source and an ammeter connected to the signal line, and a voltmeter connected to the sensing line.

6. The jig of claim 1, wherein the impedance measuring board is installed on a lower part of the jig body, wherein the conducting line for impedance measurement includes a loop connecting the first bus bar, the impedance measuring board, and the second bus bar, and wherein a part of the loop extends in the longitudinal direction of the battery cell along a bottom surface of the jig body.

7. The jig of claim 6, further comprising pedestals installed on a first lower sides of the jig body and a second lower side of the jig body, wherein the impedance measuring board is installed on the pedestals or the lower part of the jig body adjacent to the pedestals.

8. The jig of claim 6, further comprising pedestals installed on both lower sides of the jig body, wherein the impedance measuring board is installed on a measuring board support coupled to the pedestals.

9. The charging and discharging jig of claim 6, further comprising- a conducting line support member on the bottom surface of the jig body, wherein the conducting line support member is configured to support a conductive line extending in the longitudinal direction of the battery cell along the bottom surface of the jig body.

10. The jig of claim 6, further comprising fixing jigs on a first side and a second side of the bottom surface of the jig body, wherein the fixing jigs are configured to fix a first sides and a second side of a conducting line extending in the longitudinal direction of the battery cell along the bottom surface of the jig body.

11. The jig of claim 6, wherein the impedance measuring board is installed in the a middle of the bottom surface of the jig body, and wherein the loop is drawn out to a first side and a second sides of the impedance measuring board and extends toward each of the first bus bar and the second bus bar.

12. The jig of claim 1, wherein the jig body includes a fixed block and a movable block slidably coupled to the fixed block, and wherein the first bus bar is installed on one a side of the fixed block and the second bus bar is installed on a side of the movable block.

13. The jig of claim 12, wherein the movable block is slidably coupled to an upper surface of the fixed block.

14. The jig of claim 13, wherein guide slits are formed on both first and second sides of at least one of the fixed block or the movable block, and wherein sliding support members inserted into the guide slits are installed on the fixed block or the movable block that does not include the guide slits.

15. The jig of claim 14, wherein each of the sliding support members has a body part inserted into at least one of the guide slits and screwed to the fixed block or the movable block, and wherein a head part has a width greater than that of the at least one of the guide slits.

16. The jig of claim 1, wherein the jig is configured to charge and discharge the battery cell.

* * * * *